(12) United States Patent
Brophy et al.

(10) Patent No.: US 6,892,449 B1
(45) Date of Patent: May 17, 2005

(54) METHOD OF MANUFACTURING ELECTRO-OPTICAL DEVICES

(75) Inventors: Brenor Brophy, San Jose, CA (US); Marc Hartranft, Scotts Valley, CA (US); Syed Tariq Shafaat, Freeland, WA (US); Jeff Hall, Atlanta, GA (US)

(73) Assignee: Cypress Semiconductor Corp., San Jose, CA (US)

( * ) Notice: Subject to any disclaimer, the term of this patent is extended or adjusted under 35 U.S.C. 154(b) by 198 days.

(21) Appl. No.: 10/268,205

(22) Filed: Oct. 9, 2002

(51) Int. Cl.[7] ........................................... H01R 43/00
(52) U.S. Cl. ............................ 29/827; 29/417; 29/829; 29/830; 29/832; 29/835; 29/846; 257/98; 257/680; 385/88
(58) Field of Search .................... 29/412–417, 827, 29/830, 842, 846, 831–835; 174/260; 257/99, 257/100, 532–434, 668; 361/760, 783, 813; 385/88–94; 438/26–29, 31

(56) References Cited

U.S. PATENT DOCUMENTS

| | | | | |
|---|---|---|---|---|
| 4,126,882 A | * | 11/1978 | Carson et al. | 257/697 |
| 4,867,371 A | * | 9/1989 | Davis et al. | 228/160 |
| 5,424,573 A | | 6/1995 | Kato et al. | 257/431 |
| 5,818,404 A | * | 10/1998 | Lebby et al. | 345/82 |
| 6,243,508 B1 | * | 6/2001 | Jewell et al. | 385/14 |
| 6,325,552 B1 | | 12/2001 | Brillhart | 385/88 |
| 6,518,656 B1 | | 2/2003 | Nakayama et al. | 257/680 |
| 6,686,588 B1 | | 2/2004 | Webster et al. | 250/239 |
| 6,815,729 B1 | * | 11/2004 | Brophy et al. | 257/98 |
| 2003/0128442 A1 | | 7/2003 | Tanaka et al. | 359/819 |

* cited by examiner

*Primary Examiner*—Minh Trinh
*Assistant Examiner*—Donghai D. Nguyen
(74) *Attorney, Agent, or Firm*—Marger Johnson & McCollom, P.C.

(57) ABSTRACT

A method of manufacturing a plurality of electro-optical sub-assemblies in parallel is provided. A plurality of printed circuit boards (PCBs) are preferably formed in a panel of flex material. Rigid substrates can be arranged along regions of the PCBs. A plurality of electrical components, including electro-optical semiconductor devices, are preferably located on the rigid substrates. Lens arrays are preferably aligned over the electro-optical semiconductor devices, such as through an alignment mechanism. The PCBs can then be singulated into individual electro-optical sub-assemblies. The rigid substrates can be a plurality of leadframes formed on a matrix leadframe. The matrix leadframe is preferably attached to the panel of flex material such that the leadframes are arranged in proximity to leadframe cutout regions of the PCBs. Electrical interconnections are then preferably formed between the electrical components on the leadframe and the PCBs.

17 Claims, 14 Drawing Sheets

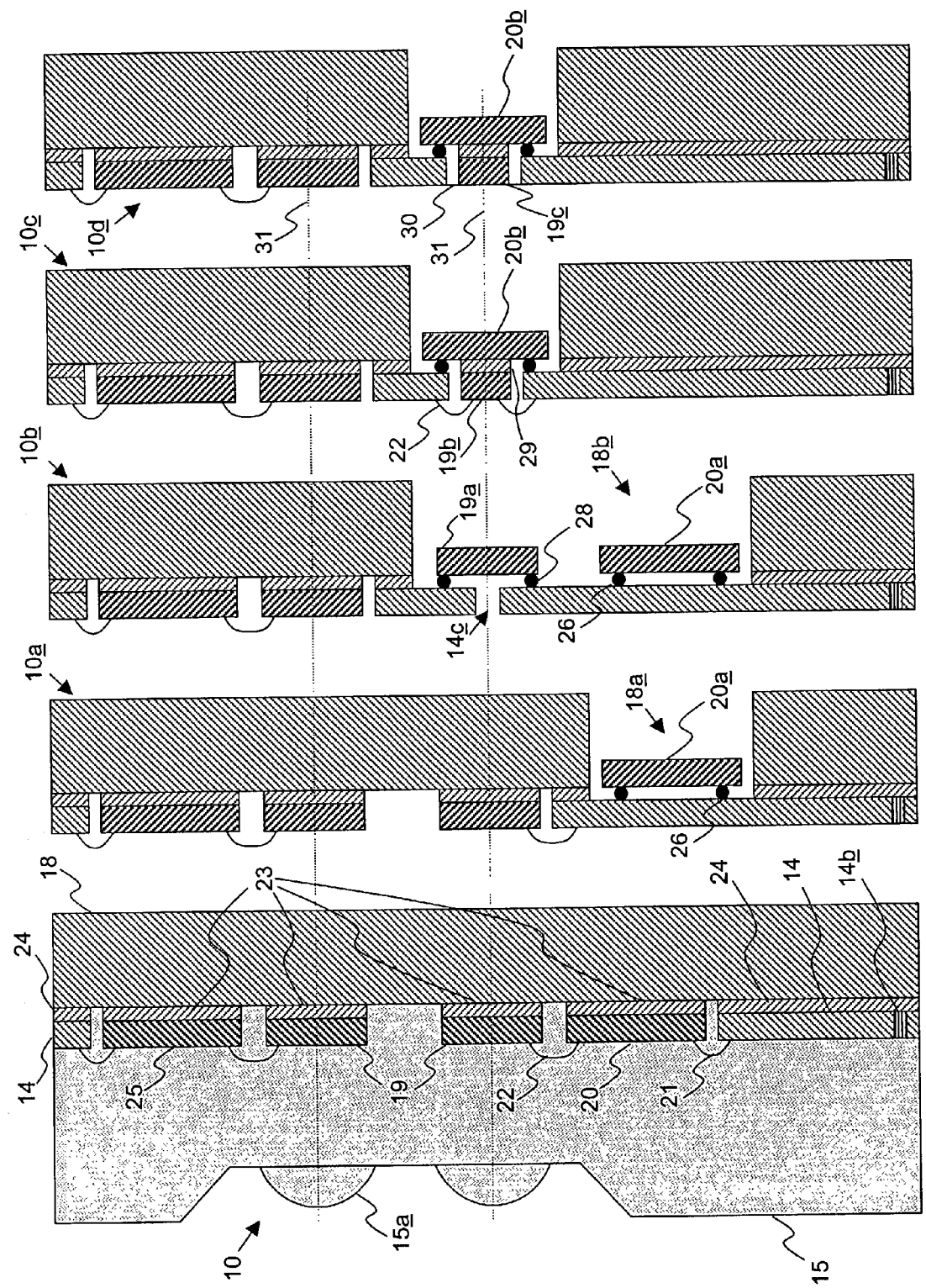

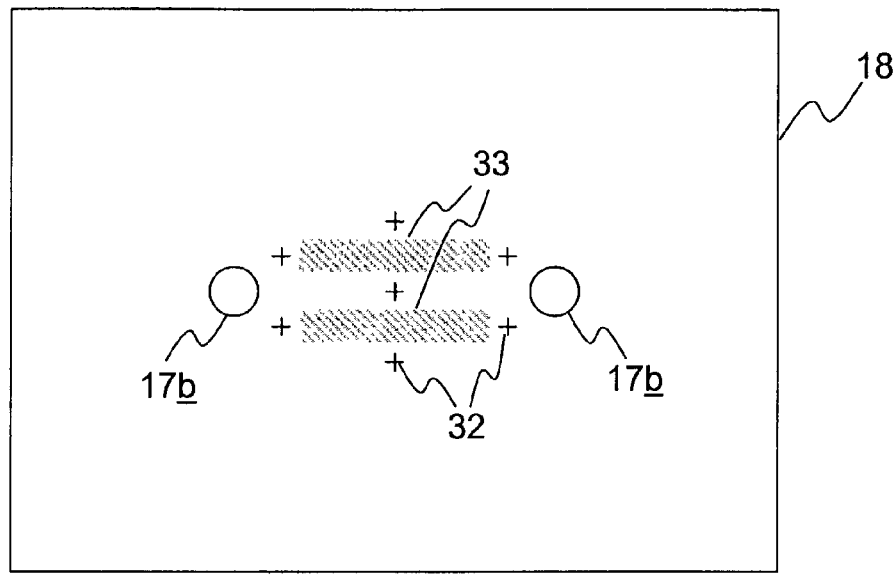
FIG. 5
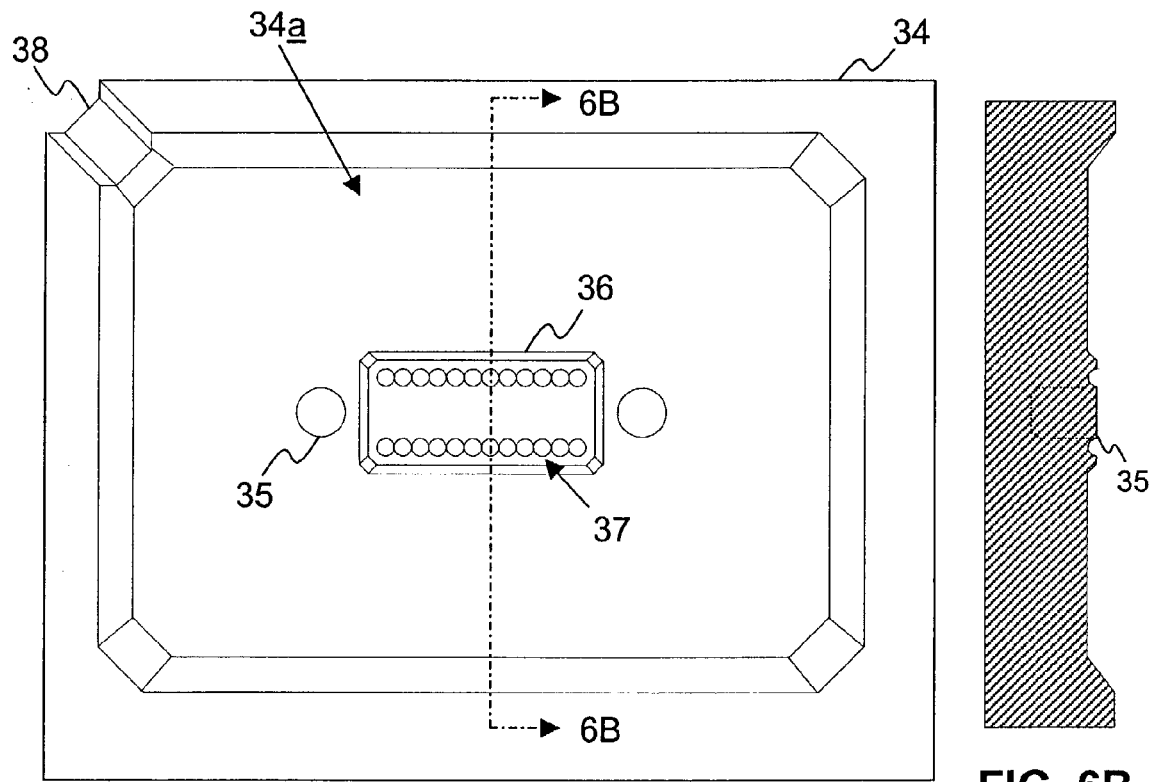
FIG. 6A
FIG. 6B

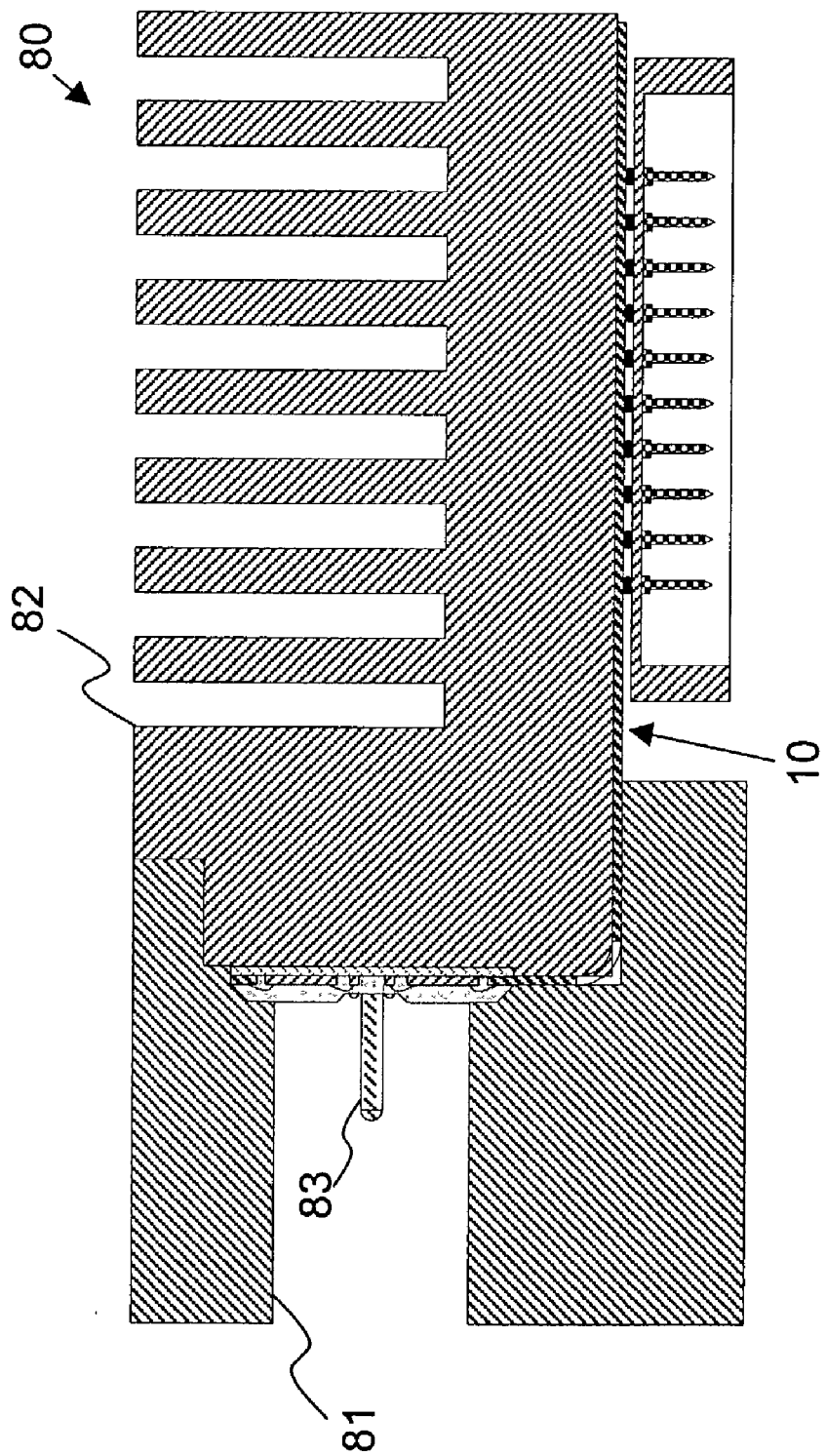

METHOD OF MANUFACTURING ELECTRO-OPTICAL DEVICES

BACKGROUND OF THE INVENTION

1. Field of the Invention

The present invention relates to devices for converting between electrical and optical signals. More particularly, this invention relates to a method of manufacturing electro-optical devices.

2. Description of Related Art

Electro-optical modules can be used to convert electrical signals into optical signals and vice versa. Many different types of electro-optical modules are presently being manufactured. These modules have many applications, particularly within data-communications technology where electrical signals are carried by fiber optics, and can range in cost from under a hundred dollars to many thousands of dollars per module, depending on their application and functionality.

Different types of electro-optical modules can be used to perform different functions. Receive modules and transmit modules, for example, can each be used to provide half of an electro-optical conversion. More particularly, receive modules convert optical signals into electrical signals as part of a receive function. Transmit modules convert electrical signals into optical signals as part of a transmit function. Transceiver modules can be used to perform the electro-optical conversion for both receive and transmit paths. Transponder modules provide the same functionality as transceiver modules but also provide serialization and deserialization of the electrical signals.

Modules can be further categorized based on the type of light emitter used. Typical light emitters include surface emitting sources (such as Light Emitting Diodes (LEDs) and Vertical Cavity Surface Emitting Lasers (VCSELs)) and edge emitting sources (such as Fabry-Perot lasers and Distributed Feedback (DFB) lasers). Surface emitting light sources are generally used in the manufacture of low-cost modules.

The primary advantages of surface emitting light sources are in testing and assembly. Surface emitters can, for example, be easily tested on whole wafers. No assembly of the individual modules is therefore required before testing the part. The assembly process is also simpler because the edges of the parts do not need to be polished. In addition, surface emitters can be easily assembled into arrays of multiple emitters (for example, a 1×12 array of VCSELs). Surface emitter arrays greatly simplify the assembly of parallel optical modules.

There are several challenges, however, in manufacturing optical modules. Among these challenges, it is difficult to align an optical fiber to an active optical area of a light emitter or a light detector. In addition, emitters may degrade or malfunction at relatively low temperatures, and removing heat from the emitters can be difficult. It is also difficult to test conventional modules. Another challenge is minimizing the number of parts required in the module assembly. A lack of "batch" manufacturing process steps also prevents lower cost manufacturing of modules. Some conventional solutions to these challenges are described briefly below.

Manufacturers of optical modules generally use some type of lens system (such as a spherical lens) to focus light into and out of the optical fiber. FIG. 1 is a schematic illustration of a conventional lens focusing system for an optical module. Referring to FIG. 1, this conventional focusing system includes a spherical lens 1, a multi-mode optical fiber 2 with an optical core 2a, and an electro-optical component 3 with active area 3a. These parts collectively form a system having an optical axis 4 and a ray trace 5. The surrounding material 6 is typically air.

The use of a lens is advantageous for at least two reasons. First, it acts as a light gathering element to collect the light from the emitting side. Second, it acts as a light focusing element to converge the light on the receiving side. These two actions result in a relaxation of the alignment tolerances between the emitting and receiving sides. In effect, the lens acts as a large target area for the emitter, when compared to the size of the receiver, while creating a focused spot that is small compared to the size of the receiver. Thus, the emitter may move around to some extent and still hit the lens, and the receiver may also move around to some extent and still have the focused spot fall within its active area.

Even with a lens, however, the alignment tolerances in a typical module require an active alignment process, which is conducted during the assembly of the optical system. In this process, the optical emitter is switched on and an output of the optical receivers is measured. The whole assembly is then micro-manipulated, typically by a human operator, to maximize the received signal by bringing all sub-components into fine alignment. A flash cure process is then typically performed to freeze the assembly in place once fine alignment has been achieved.

There are disadvantages with the current methods for optical alignment. Optical elements such as glass lens arrays may be expensive. They are also typically small and may be delicate and difficult to handle and manipulate. Given that the optical assembly must be adjusted for fine alignment, some allowance must be made in the module design to facilitate this adjustment step. Active alignment is a slow, human driven process and is consequently expensive and error prone. Problems with optical alignment or failure to align correctly can create a significant rate of failure during the assembly process, further increasing the production costs of the module.

It would be advantageous to achieve optical alignment without an active alignment step through the inherent construction of the module (called "passive alignment"). It would be further advantageous if the optical components were very low cost and if there was no requirement to handle them as a separate sub-assembly.

Thermal management is also difficult in conventional optical modules. Optical transceiver or transponder modules, for example, typically require four different types of discrete semiconductor chips in close physical association with the optical axis. The light emitter and light detector are arranged on the optical axis. A driver chip for the emitter and an amplifier chip for the detector are also typically required. Emitters usually consume a significant amount of electrical power. The connection between the emitter and the driver chip is a major source of Electro-Magnetic Interference (EMI) and the signal degrades as the length of the connection increases. It is therefore advantageous to locate the emitter driver close to the emitter to limit the length of the connection. It is also advantageous to locate the receiver amplifier close to the detector because the detector output signal is very weak and therefore quickly degrades as the connection length increases.

These four semiconductor chips are therefore typically located in a very small area that is physically close to the emitter. Each chip consumes power that is dissipated as heat. In the case of a VCSEL emitter, for example, this heat may cause the VCSEL to function poorly in terms of its optical power output (slope efficiency), threshold current, and center wavelength accuracy. Or it may cause the VCSEL emitter to stop functioning completely. In addition, it may cause premature aging and early failure of the VCSEL. It is therefore desirable to provide an efficient conduction path for drawing heat away from the VCSEL.

FIGS. 2A and 2B show typical thermal control solutions in a conventional optical module. More particularly, FIG. 2A illustrates four semiconductor devices 7 bonded with die attach material 8 to a circuit board 9. The circuit board 9 contains thermal vias 9a and is abutted to a metal heatsink 10. FIG. 2B illustrates two semiconductor components 11 bonded directly to a metal heatsink 13 with die attach material 12. In both of these examples, the metal heatsink is able to fairly efficiently transfer heat away from the semiconductor components to the cooler surrounding medium.

Conventional thermal management solutions, however, require that the semiconductor devices be bonded to thermally conductive materials. This may be a disadvantage if it prevents or impacts the ability to optically align or test the module. For example, bonding small optical components directly to a large heatsink requires manipulation of the entire heatsink in order to accurately align optical components.

In some cases, a separate, small circuit board may be used as an "optical substrate" on which optical die are mounted. The use of an optical substrate adds additional cost to the system, however, because it requires the formation of thermal vias through the substrate and possibly requires other thermal management. In that solution, a second circuit board, without additional thermal management features, is then required to route the signals from the optical substrate to the module output connector. This arrangement adds complexity, difficulty, and cost to the manufacturing process.

It would be advantageous if thermal management of the module could be accomplished without impacting the alignment of the module, while still providing the most optimal path for heat transfer away from the VCSEL. It would be further advantageous if a single circuit board could be used for the module to reduce complexity and cost.

Given the complexity and number of sub-components found in a typical module, some form of testing is important to guarantee a sufficient level of quality to the end user. Generally, every function of the module is tested. For example, the operation and performance parameters of the transmit function should be checked. These parameters include laser output power, extinction ratio, at-speed operation, and jitter performance. In many cases the drive parameters for each laser in the module must be electrically adjusted to enable the module to meet its specifications over the full operating temperature range. The receiving (RX) channels are tested in a similar manner to verify performance to the required Bit Error Rate (BER). The module as an entire system should also be tested because the lenses and thermal performance also contribute to its overall performance. Module manufacturers therefore typically only test fully assembled modules. This test can take a long time (e.g., 10–20 minutes) to conduct and frequently requires a human operator to handle the module and conduct the test.

Currently, very few VCSEL suppliers are capable of guaranteeing zero defects for early life failures for unpackaged parts. Those that can make this guarantee charge a premium price for their product. Thus, module manufacturers who use VCSELs must burn-in their fully assembled modules for some period to eliminate modules whose VCSELs fail early in their life.

One of the fundamental disadvantages of conventional module designs is that you may only test and burn-in the fully assembled module. This means that defects that may occur at any point in the process are not detected until the final step. It further means then when a module fails, the full cost of the assembled module is lost. In addition, the modules are relatively large and difficult to handle with automated equipment and human intervention is therefore frequently required to insert and remove these modules from test fixtures.

It would be advantageous if the electro-optical components could be fully tested for alignment, operation, and performance as a single sub-assembly prior to final assembly into a finished module. Thus, the full cost of the module would not be incurred if the electro-optical sub-assembly failed. It would be further advantageous if the fully testable electro-optical sub-assembly were easy to handle and test with automated equipment. It would be advantageous if the electro-optical sub-assembly were compact and easy to store in standard sized component trays, which are used by most available semiconductor handling equipment. It would be advantageous if fully tested electro-optical sub-assemblies were able to be stored in inventory so that modules could be quickly assembled with various different styles of heatsink, which is a typical requirement of module customers.

There are also disadvantages with the current methods for manufacturing, as well as with the quality and reliability of the finished product. Conventional modules are generally manufactured manually. They also typically include multiple small circuit boards and various other mechanical sub-components that must each be handled and placed in the module. There are no common form-factor methods (such as industry standard component trays that exist for semiconductors) for storing or handling the various sub-components of the optical modules. There is therefore little or no automated equipment available off the shelf to automate the assembly process. Because the process is primarily manual, it is prone to human error as well as poor process control. This impacts the manufacturing yield, as well as the quality and reliability of the product.

It would therefore be advantageous to have a module design that can be manufactured using a fully automated assembly process. It would be further advantageous if this assembly process could be performed using commonly available equipment, such as manufacturing equipment used in the semiconductor industry. It would also be advantageous if the assembly processes and materials used in the module assembly were commonly used and well understood. A module designed to have these advantages would be easier to manufacture at lower cost and at superior levels of yield, quality, and reliability.

SUMMARY OF THE INVENTION

A method of manufacturing a plurality of electro-optical sub-assemblies in parallel is provided. A plurality of printed circuit boards (PCBs) are preferably formed in a panel of flex material. Rigid substrates can be arranged along regions of the PCBs. A plurality of electrical components, including electro-optical semiconductor devices, are preferably located on the rigid substrates. Lens arrays are preferably aligned over the electro-optical semiconductor devices, such as through an alignment mechanism. The PCBs can then be singulated into individual electro-optical sub-assemblies.

The rigid substrate can, for example, be a leadframe or a rigid area of the PCB. Where the rigid substrate is a leadframe, the rigid substrate is preferably arranged along a region of each of the PCBs by forming a leadframe cutout region in each of the PCBs. A plurality of leadframes can be formed on a matrix leadframe and the matrix leadframe can be attached to the panel of flex material such that the leadframes are arranged in proximity to the leadframe cutout regions of the PCBs. Electrical interconnections are then preferably formed between the electrical components on the leadframe and the PCBs.

BRIEF DESCRIPTION OF THE DRAWINGS

The foregoing and additional aspects and advantages of the present inventive concepts will become more readily apparent through the following detailed description of preferred embodiments, made with reference to the attached drawings, in which:

FIG. 4A is an enlarged cross-sectional view of the leadframe area of the EOSA shown in FIGS. 3A through 3C;

FIGS. 4B through 4E are enlarged cross-sectional views of a leadframe area of an EOSA constructed according to various alternative embodiments;

FIG. 5 is a schematic plan view of a leadframe, showing alignment features thereof, according to yet another inventive concept;

FIGS. 6A through 6D are schematic plan, bottom, and cross-sectional views of an Over-Molded Lens Array (OMLA) mold according to a still further inventive concept;

FIG. 15 is a cross-sectional view of an assembled electro-optical module including the EOSA of FIGS. 3A through 3C according to yet other inventive concepts.

DETAILED DESCRIPTION OF PREFERRED EMBODIMENTS

The present inventive principles will be described more fully hereinafter with reference to preferred embodiments thereof. It should be noted, however, that the embodiments disclosed herein are provided by way of example, and not by way of limitation, and may be modified in form and detail without departing from the principles and scope of the inventive concepts.

A low cost optical module and a process for manufacturing the optical module are disclosed. According to a preferred embodiment, a parallel optical module uses surface emitting light sources (such as LEDs and VCSELs) and includes many fibers (e.g., 24 fibers) in a fiber-ribbon interface. The inventive principles herein can also be applied, however, to modules having other light sources and to those having single or dual fiber connections of individual fibers. The inventive principles herein further apply to transceivers, transponders, receive and transmit, and other types of optical modules.

According to the inventive concepts disclosed herein, an Electro-Optical Sub-Assembly (EOSA) can be manufactured using standard semiconductor assembly equipment. Manufacturing processes for the EOSA can therefore be completed at lower cost and with a shorter manufacturing cycletime, while providing a higher yield and a more reliable and higher quality product as compared to conventional modules. The process also provides the ability to manufacture a large number of module sub-assemblies in parallel (e.g., twenty or more on a single leadframe). This parallel manufacturing capability also greatly reduces costs compared to conventional, one-at-a-time manufacturing methods.

An EOSA constructed according to a preferred embodiment can be a fully integrated, independently-testable sub-assembly. Thus, test and burn-in processes may be performed on this sub-component before it is fully assembled into an optical module. The ability to independently test this sub-assembly reduces cost, increases the yield of final assembled modules, and allows greater flexibility by permitting the assembly of multiple different module form factors using the same EOSA sub-component.

Electro-Optical Sub Assembly (EOSA)

Figure 1:
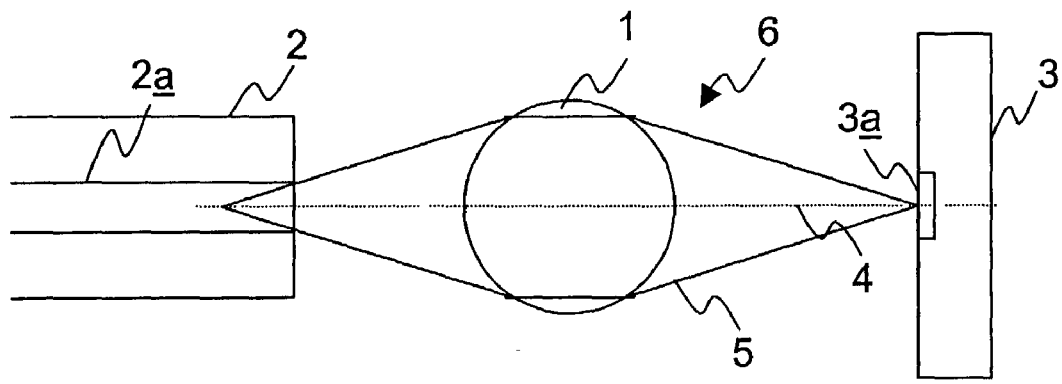
FIG. 1 is a schematic illustration of a conventional lens focusing system for an optical module.
Figure 2A:
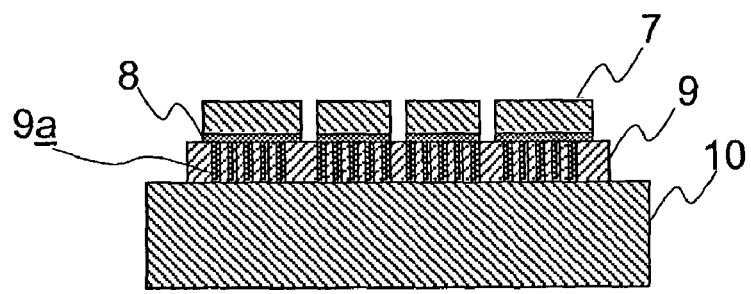
FIGS. 2A and 2B show typical thermal control solutions in conventional optical modules.
Figure 2B:
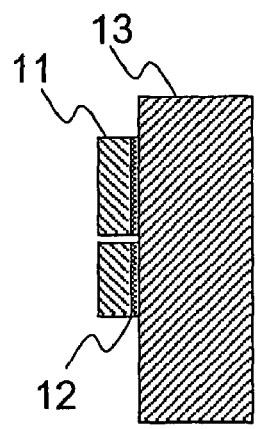
Figure 3A:
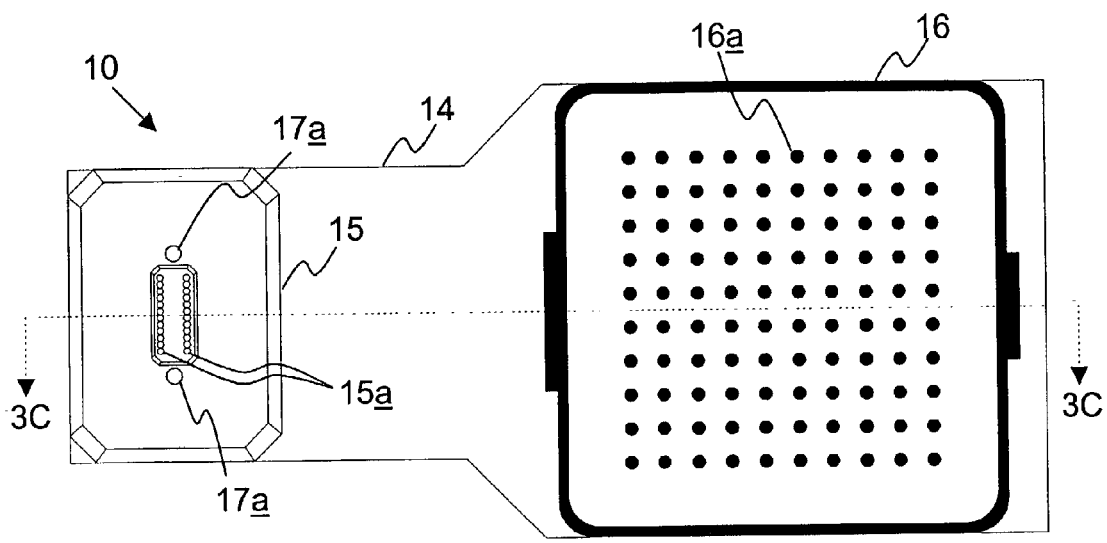
FIGS. 3A through 3C are schematic plan and cross-sectional views of an Electro-Optical Sub-Assembly (EOSA) according to an embodiment of the present inventive concepts.

An optical module according to one embodiment preferably includes a single, fully testable Electro-Optical Sub-Assembly (EOSA). The EOSA can be configured, for example, for use in a twelve-channel transceiver module (i.e., twelve receive and twelve transmit channels). FIG. 3A is a plan view of an EOSA 10 for a twelve-channel transceiver module constructed according to various inventive principles disclosed herein.

Referring to FIG. 3A, the EOSA 10 can be constructed using a flexible printed circuit board (flex PCB) 14 that provides interconnections for electrical signals. A connector array 16 (e.g., a "Berg" or "MegArray" connector) can be soldered to the flex PCB 14 to facilitate electrical communication with external circuits. The array of connectors 16 can, for instance, contain an array of either male pins 16a or female sockets (not shown). A left end of the flex PCB 14 is preferably covered by an over-molded lens array (OMLA) 15, formed of an optically-transparent, injection-molded material. The OMLA 15 in this particular embodiment is a 2×12 array of lenses 15a. These lenses 15a provide optical alignment for electro-optical semiconductor components arranged beneath the OMLA 15.

Figure 3B:
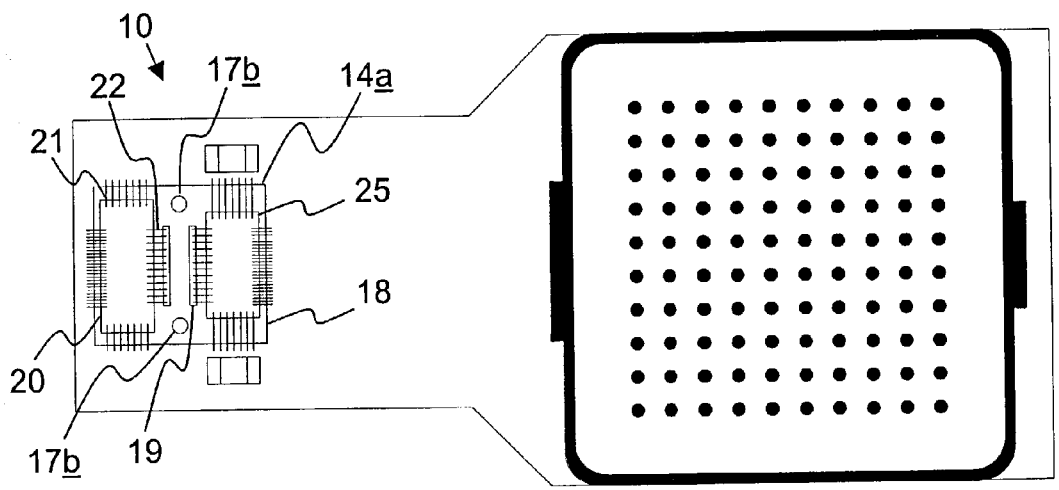

FIG. 3B is a plan view of the EOSA 10 of FIG. 3A, shown having the OMLA 15 removed to reveal structures arranged thereunder. Referring to FIG. 3B, the flex PCB 14 can include a cutout region 14a. Although rectangular in the figures, the cutout region 14a can be any desired size or shape. The cutout region 14a is preferably arranged to expose an upper surface of a leadframe 18 bonded to an underside of the PCB 14. In this embodiment, two electro-optical semiconductor devices 19 are included on the leadframe 18. Each electro-optical semiconductor device 19 can include a plurality of active elements. For example, each device 19 can include an array of twelve electro-optical elements. Interface semiconductor devices, such as a driver chip 20 associated with an emitter and an amplifier chip 25 associated with a sensor, are also preferably included.

Referring now to FIGS. 3A and 3B, alignment holes 17a, 17b are preferably arranged through the sub-assembly, including the OMLA 15 and the leadframe 18, respectively, to provide an alignment mechanism for aligning the lenses 15a of the OMLA 15 over the electro-optical semiconductor devices 19. This alignment mechanism facilitates quick and accurate alignment of the lenses 15a over active areas of the electro-optical devices 19. Any other mechanism that can provide rapid and accurate alignment of the lenses 15a over the electro-optical devices 19 could also be used.

Figure 3C:
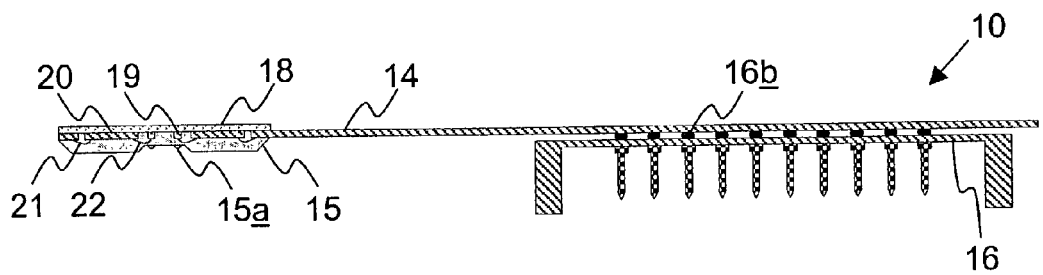

FIG. 3C is a cross-sectional view of the EOSA taken through line 3C—3C of FIG. 3A. Referring to FIG. 3C, the array connector 16 is preferably fixed to the flex PCB 14 using solder joints 16b. The leadframe 18 is preferably bonded to the back of the flex PCB 14 at the left end of the flex PCB 14. In this embodiment, the electro-optical semiconductor devices 19 and their associated interface semiconductor devices 20, 25 are bonded to the surface of the leadframe 18. Die to die wirebonds 22 can be used to connect the electro-optical components to their respective interface chips 20, 25. Die to flex PCB wirebonds 21 can be used to connect the interface chips 20, 25 to the flex PCB. The OMLA 15 preferably covers the entire die and wirebond area and includes a plurality of lens elements 15a that are optically aligned over active areas of the electro-optical semiconductor devices 19.

One significant advantage of the EOSA described above is that it incorporates both the optical and electrical functionality of an electro-optical module into an easily manufactured and tested sub-assembly. Several other advantages and further inventive concepts will become apparent through the descriptions contained in the following sections.

Platform Flexibility

The combination of a rigid leadframe with a flexible PCB creates a platform that can be easily and readily modified to accommodate numerous variations in the type and arrangement of components used to create the sub-assembly. In the market today, a large number of different devices are available from various manufacturers that are capable of performing the electro-optical conversion and interface functions. These devices vary in size, power dissipation, and in the type of electrical and optical interfaces. For example, photo-detectors may be supplied with wirebond pads or with solder-bumps to facilitate the electrical interface. A photo-detector may have two electrical contacts (e.g., anode and cathode terminals of a diode) on its top side or it may have a single top-side contact and a single bottom-side contact.

Accordingly, a module technology that permits variations in the type and arrangement of electrical and optical components without significant modifications is extremely beneficial. The technology described herein permits the choice of optimal electro-optical components to provide the desired functionality of the module. It also provides a flexible platform that can readily incorporate improved technologies. For example, with this platform arrangement, electro-optical components that utilize wirebond interconnections may be used for lower-speed modules. For higher-speed modules that require faster components, this platform provides the adaptability to use solder-bumped components, which operate better at higher speeds.

FIG. 4A is an enlarged cross-sectional view of a leadframe area of the EOSA 10 shown in FIGS. 3A through 3C, illustrating in detail an attachment between the semiconductor devices 19, 20, 25 and the leadframe 18 using a die-attach material 23. The die-attach material 23 may be electrically conductive or non-conductive. Not all of the semiconductor chips 19, 20, 25 need to use the same type of die-attach material 23. For example, some may use a conductive die-attach material while others may use a non-conductive die-attach material. The leadframe 18 is also preferably bonded to the flex PCB 14 using a bonding material 24. The bonding material 24 can, but need not, be the same as the die-attach material 23 used to attach the semiconductor devices 19, 20, 25 to the leadframe 18.

The flex PCB 14 can include via structures 14b that provide electrical contact from the flex PCB 14 to the leadframe 18 through a conductive attach material. These vias 14b are in addition to any other vias (not shown) within the flex PCB 14 that provide simple interconnections between the various conductive layers. The OMLA 15 preferably includes integrated lens elements 15a. The optical axes from the active areas of the electro-optical semiconductor devices through the OMLA lenses 15a are indicated by dashed lines 31. In FIGS. 4B through 4E, the OMLA 15 has been omitted from the drawings for clarity, but can be provided in a form similar to that shown in FIG. 4A.

FIGS. 4B through 4E are enlarged cross-sectional views of the leadframe area of an EOSA constructed according to various alternative embodiments of the inventive principles herein disclosed. Labels used in the drawings, and descriptions thereof, apply to similar structures in each of other FIGS. 4A through 4E, although omitted from some of the drawings for clarity. It should be noted that FIGS. 4A through 4E are exemplary only and do not reflect every possible embodiment. Rather, these figures simply illustrate a few of the many possible embodiments enabled by the inventive principles disclosed herein.

FIG. 4B, for example, illustrates an EOSA 10a in which a flip-chip device 20a provides one of the interface semiconductor devices. The flip-chip device 20a has an electrical interface with the flex PCB 14 provided through solder bumps 26 rather than wirebonds. A cutout 18a in the leadframe 18 accommodates the flip-chip mounting of the interface semiconductor chip 20a to the backside of the flex PCB 14. The cutout 18a can be filled with a thermally conductive material (see FIG. 7) to facilitate the transfer of heat away from the backside of the device 20a.

FIG. 4C shows an embodiment of an EOSA 10b in which both the electro-optical component 19a and its associated interface component 20a are flip-chip devices, whose electrical interfaces are provided through solder bumps 28, 26, respectively, rather than through wirebonds. In this embodiment, a larger cutout 18b is provided in the leadframe 18 to accommodate the flip-chip devices 19a, 20a. In addition, a small cutout 14c in the flex PCB 14 allows light to pass through to the optical component 19a to provide optical communication with the OMLA 15.

FIG. 4D illustrates an embodiment of an EOSA 10c in which a wire-bonded electro-optical chip 19b is stacked on top of an associated interface component 20b. The die-attach material 29 may or may not be used to create an electrical connection between the two devices 19b, 20b. The die-attach material can, for example, be a silver epoxy (a typical conductive die-attach material), a solder joint, or any other conductive or non-conductive material.

FIG. 4E shows another embodiment of an EOSA 10d similar to the EOSA 10c shown in FIG. 4D. In the embodiment shown in FIG. 4E, however, the electro-optical component 19c is connected to the flex PCB 14 using Tape Automated Bonding (TAB) rather than wirebonding. TAB connections 30 form an electrically superior interface compared to standard wirebond connections 22.

Optical Alignment

Another advantage of the Electro-Optical Sub-Assembly (EOSA) constructed according to various inventive principles described herein is provided through optical alignment of the sub-assembly components. In particular, three elements should be optically aligned to provide functionality to the electro-optical module. These three elements include a fiber core, the lens elements, and active areas of the electro-optical semiconductor devices.

In a preferred embodiment, alignment pins and associated alignment holes in the EOSA provide an alignment mechanism for locating a fiber ferrule with respect to the EOSA. Referring to FIGS. 3A through 3C, for example, respectively arranging alignment holes 17b, 17a in a rigid leadframe 18 and a precision molded lens array 15, helps provide the desired alignment as an inherent part of the manufacturing process.

FIG. 5 is a schematic plan view of a leadframe 18, showing alignment features thereof according to a preferred embodiment. Referring to FIG. 5, the leadframe 18 preferably includes two precision drilled datum holes 17b. The leadframe 18 also preferably includes fine alignment fiducials 32 marked on a surface thereof. The fiducial marks 32 are small relative to the size of the datum holes 17b. Alignment bars 33 are further provided to indicate where the electro-optical semiconductor devices should be placed. These features facilitate very accurate placement of the electro-optical semiconductor devices. Using a vision system, for example, currently available die attach equipment is capable of a die placement accuracy of approximately ±5 µm in production. Currently available CNC machining equipment is capable of drilling holes and marking fiducials to an accuracy of about ±5 µm. It is therefore possible to align the electro-optical semiconductor devices to the datum holes with sufficiently high accuracy for the present application.

Preferred characteristics of the leadframe include rigidity, mechanical stability, and the capability of forming datum holes and fiducials to desired tolerances. It is also desirable for the coefficient of thermal (CTE) expansion of the leadframe to be similar to the CTE of the electro-optical devices. Any material that meets these requirements is suitable for manufacturing the leadframe. Accordingly, metals (such as copper or aluminum), silicon wafers, or printed circuit board substrates (such as Ceramic, LTCC, FR4, or BT resin), or similar materials are all considered candidates for the leadframe material.

An Over-Molded Lens Array (OMLA) is also a useful component in providing optical alignment of an EOSA. The OMLA is preferably formed by injection molding a transparent plastic material on top of and around the leadframe. The OMLA mold is preferably designed to create an array of lens elements that are closely aligned with active areas of the electro-optical semiconductor devices.

Figures 6C, 6D:
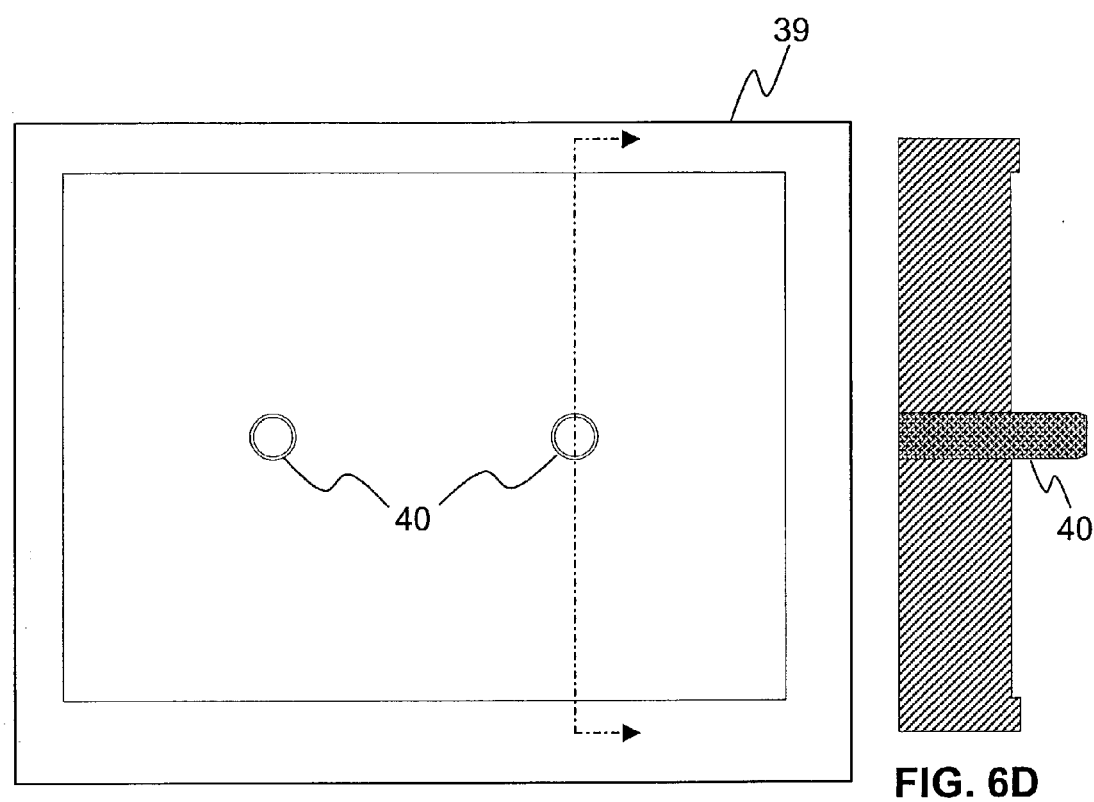

FIGS. 6A through 6D are schematic views of an OMLA mold according to a preferred embodiment thereof. FIG. 6A is a plan view of the top plate 34 of the OMLA mold. Although FIG. 6A shows a single mold cavity 34a, it should be noted that the top plate 34 preferably includes many separate mold cavities for molding multiple parts in parallel. A corner of the mold cavity 34a preferably includes a run-in channel (gate) 38 through which mold compound flows during a molding process. A raised plinth 36 in the center of the mold cavity can be used to form an indentation in the OMLA that contains the lens array. An array of precision depressions 37 in the raised plinth 36 can be used to form the lens array.

FIG. 6B shows a cross-section of the mold top plate 34 taken through a center of the raised plinth 36 in FIG. 6A. FIG. 6C shows the bottom plate 39 of the mold, which has two alignment pins 40. The alignment pins 40 serve to align the leadframe with the mold top plate 34 during the molding operation. FIG. 6D is a cross-sectional view of the mold bottom plate 39 taken through a center of one of the alignment pins in FIG. 6C.

Referring to FIGS. 6A through 6D, two holes 35 are preferably arranged in the mold top plate 34 to accommodate respective pins 40 from the mold bottom plate 39 and to thereby accurately position the top mold plate 34 during the molding process. The pins 40 are also used to accurately position the leadframe in the mold. Fine alignment between the array of lenses in the OMLA and the corresponding electro-optical components on the leadframe is accomplished, in part, through the accuracy of the mold manufacture. Specifically, accurate positioning between the alignment holes 35 and the lens forming depressions 37, helps to ensure accurate optical alignment between module components after the mold is formed.

Thermal Performance

Figure 7:
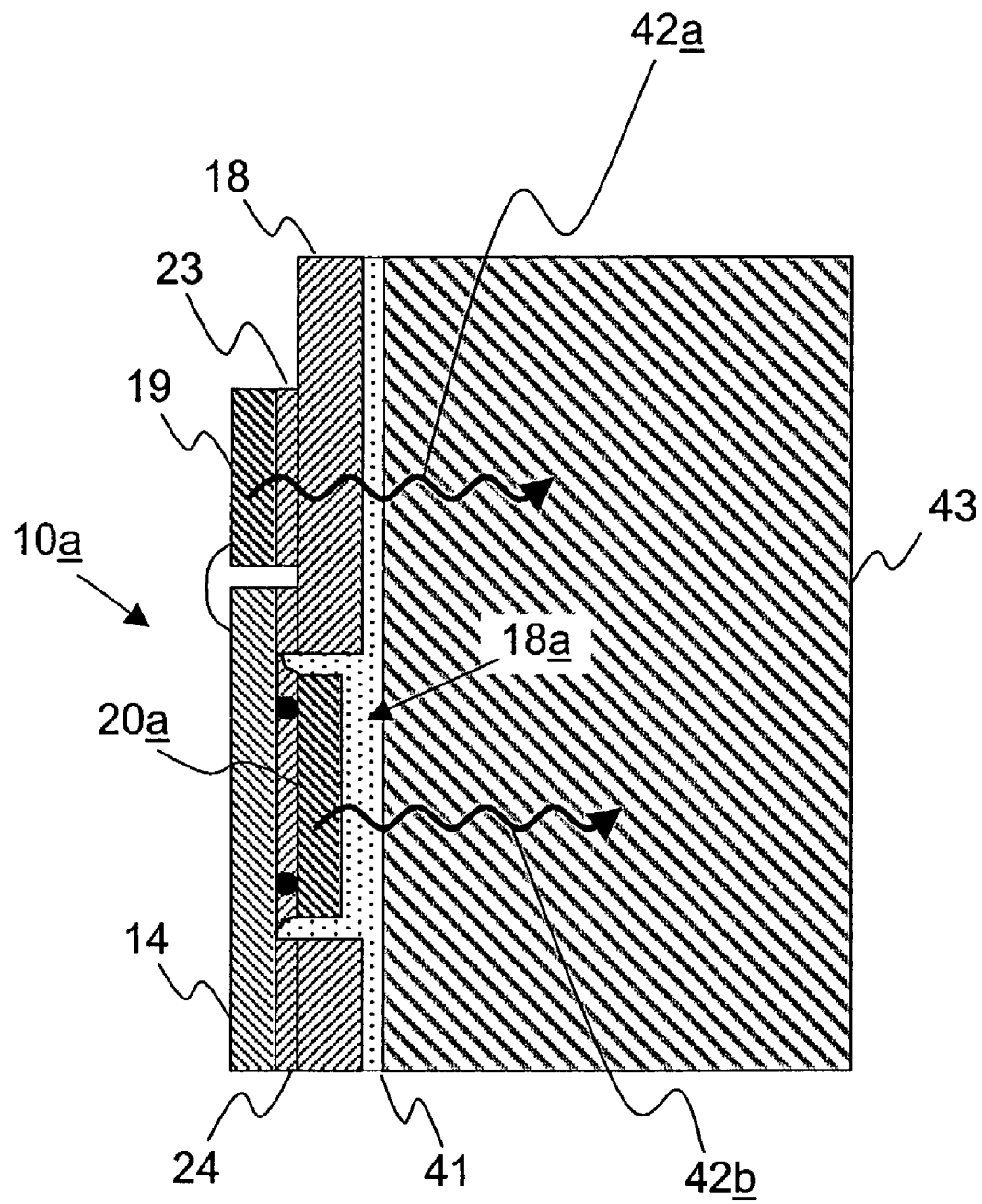
FIG. 7 is a schematic partial cross-sectional view of a flip-chip-mounted semiconductor device and a leadframe mounted semiconductor device from the leadframe area of FIG. 4B, thermally coupled to a heatsink.

Improved thermal performance is achieved by directly attaching the heat generating components to the heatsink. According to preferred embodiments of the EOSA, excellent thermal performance is provided because the leadframe acts as a first part of the heatsink. FIG. 7 is a partial cross-sectional view of the EOSA 10a in FIG. 4B having a flip-chip-mounted interface semiconductor device 20a and a leadframe mounted electro-optical semiconductor device 19, each thermally coupled to a heatsink 43. FIG. 7 illustrates the excellent thermal paths provided according to various principles of the present invention.

More particularly, as shown in FIG. 7, the EOSA 10a can include an electro-optical semiconductor device 19 mounted directly onto the leadframe 18. An interface semiconductor device 20a can be flip-chip mounted to the flex PCB 14. In this embodiment, this entire sub-assembly is attached to a heatsink 43. Space between the back of the leadframe 18 and the heatsink 43, as well as the cavity 18a containing the flip-chip device 20a, is filled with a thermally conductive material 41. Heat generated by the semiconductor devices 19, 20a may therefore readily travel to the heatsink 43 through the heat transfer paths indicated by the arrows 42a, 42b.

Manufacturing Method

Another advantage of the EOSA embodiments described above is their ability to benefit from parallel manufacturing processes such as those used in conventional semiconductor manufacturing. This provides the further ability to leverage existing investments in semiconductor assembly equipment in the EOSA production process. It also permits higher standards of quality and reliability than can be achieved using highly specialized or manual assembly processes. The following sections explain in greater detail a preferred method of manufacturing EOSAs.

Leadframe Starting Material

Figure 8:
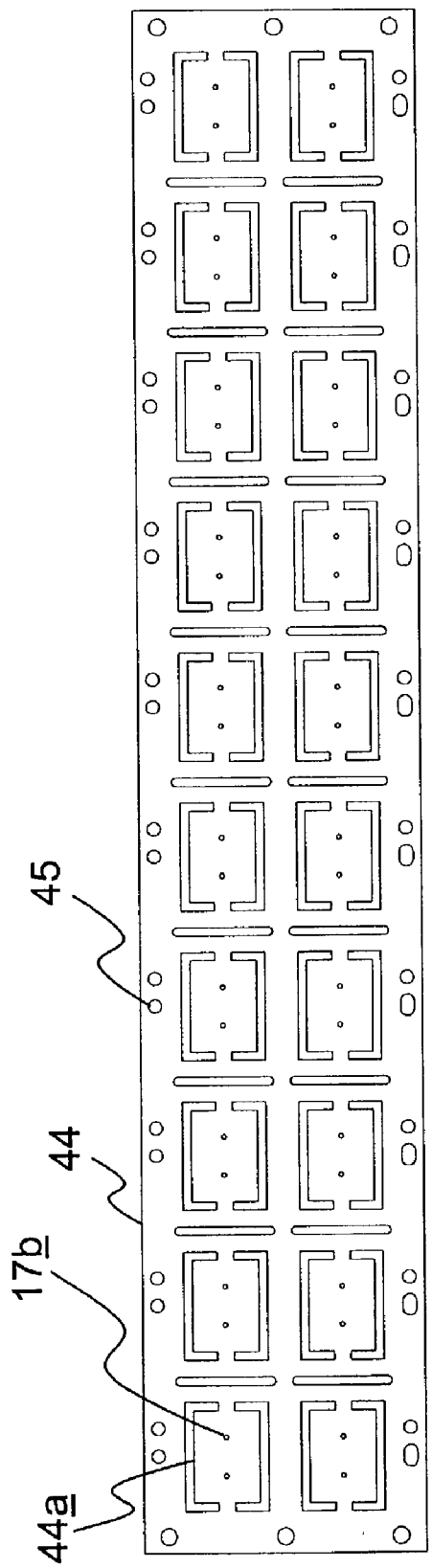
FIG. 8 shows a standard matrix leadframe used to construct the EOSA of FIGS. 3A through 3C.

FIG. 8 shows a matrix leadframe 44 used to construct an EOSA 10 according to the preferred embodiment shown in FIGS. 3A through 3C. Referring to FIG. 8, the leadframe 44 preferably contains twenty die-attach paddles 44a organized in a 2×10 array. Each paddle 44a preferably includes two precision holes 17b. Additional tooling alignment holes 45 can also be provided and used to position and move the leadframe 44 in various pieces of automated handling equipment. The leadframe 44 can, for example, be formed of a copper alloy material (e.g., alloy 194) and is preferably approximately 0.2 mm thick. The leadframe 44 can be manufactured using processes from the semiconductor industry, which have not been previously applied to the production of electro-optical modules.

Tolerances for the leadframe dimensions can be ±0.05 mm. The precision alignment holes 17b can be created in a separate process using either a precision CNC machine or laser drill, for example, and preferably meet a tolerance equal to or better than ±0.002 mm. FIG. 5 provides a more detailed view of a leadframe 18 corresponding to one of the leadframe paddles 44a of FIG. 8.

Die Attach Process

A die attach process is a process by which semiconductor die are bonded to a leadframe or substrate material. The process preferably consists of placing a carefully controlled amount of glue onto the leadframe or substrate, accurately placing a die on top of that glue, and then curing the glue to fix the die in place.

Figure 9:
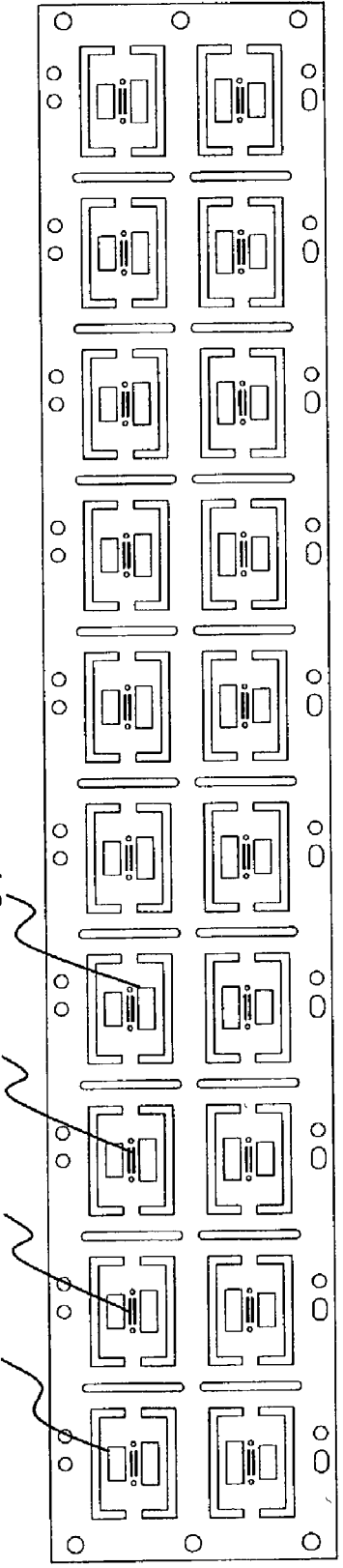
FIG. 9 shows the leadframe of FIG. 8 after completion of the die attach process.

FIG. 9 shows the leadframe 44 after completion of the die attach process. Four different dies are shown attached to each leadframe paddle 44a. Referring to FIG. 9, several different dies can be used to provide the interface and electro-optical semiconductor devices. For example, a twelve-channel Trans-Impedance Amplifier die 48, a die containing an array of twelve photo-detectors 49, a die 50 containing an array of twelve VCSELs, and/or a twelve-channel laser driver die 51 could be used.

Proper alignment between the electro-optical components 49, 50 and the alignment holes 17b is important. Proper alignment can be achieved, for example, by using a vision system on the die attach equipment that is capable of placing the die with a tolerance equal to or better than ±0.005 mm. This tolerance is within the capability of die attach equipment currently available. It should be noted that in this embodiment, the die on the bottom row of the leadframe paddles 44a are preferably placed in a pattern that is rotated 180° compared to the die arranged on the top row of the leadframe paddles 44a.

Flex PCB Manufacture and Attachment to Leadframe

Figure 10:
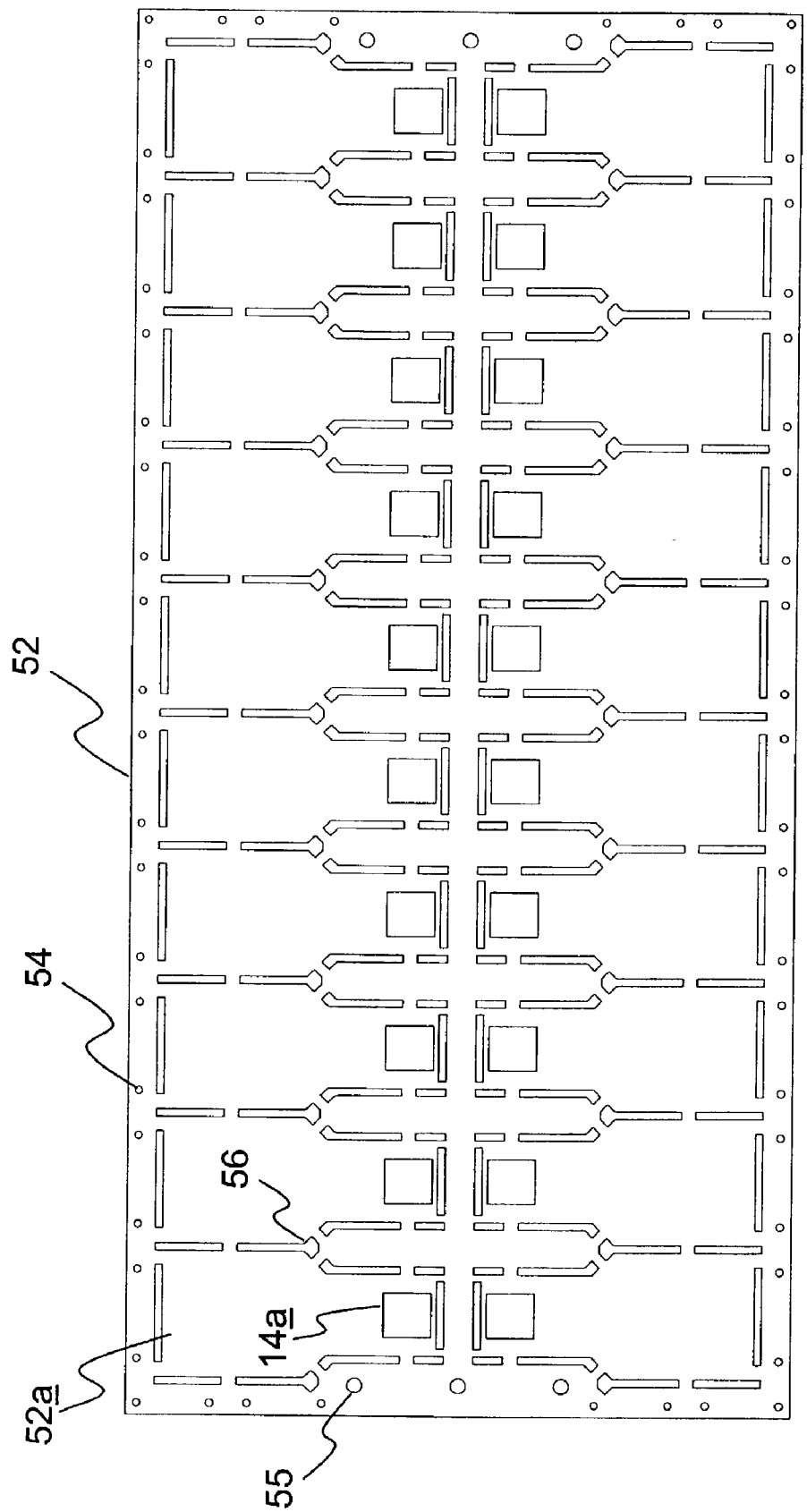
FIG. 10 shows a flex PCB panel used to construct the EOSA of FIGS. 3A through 3C.
Figure 11:
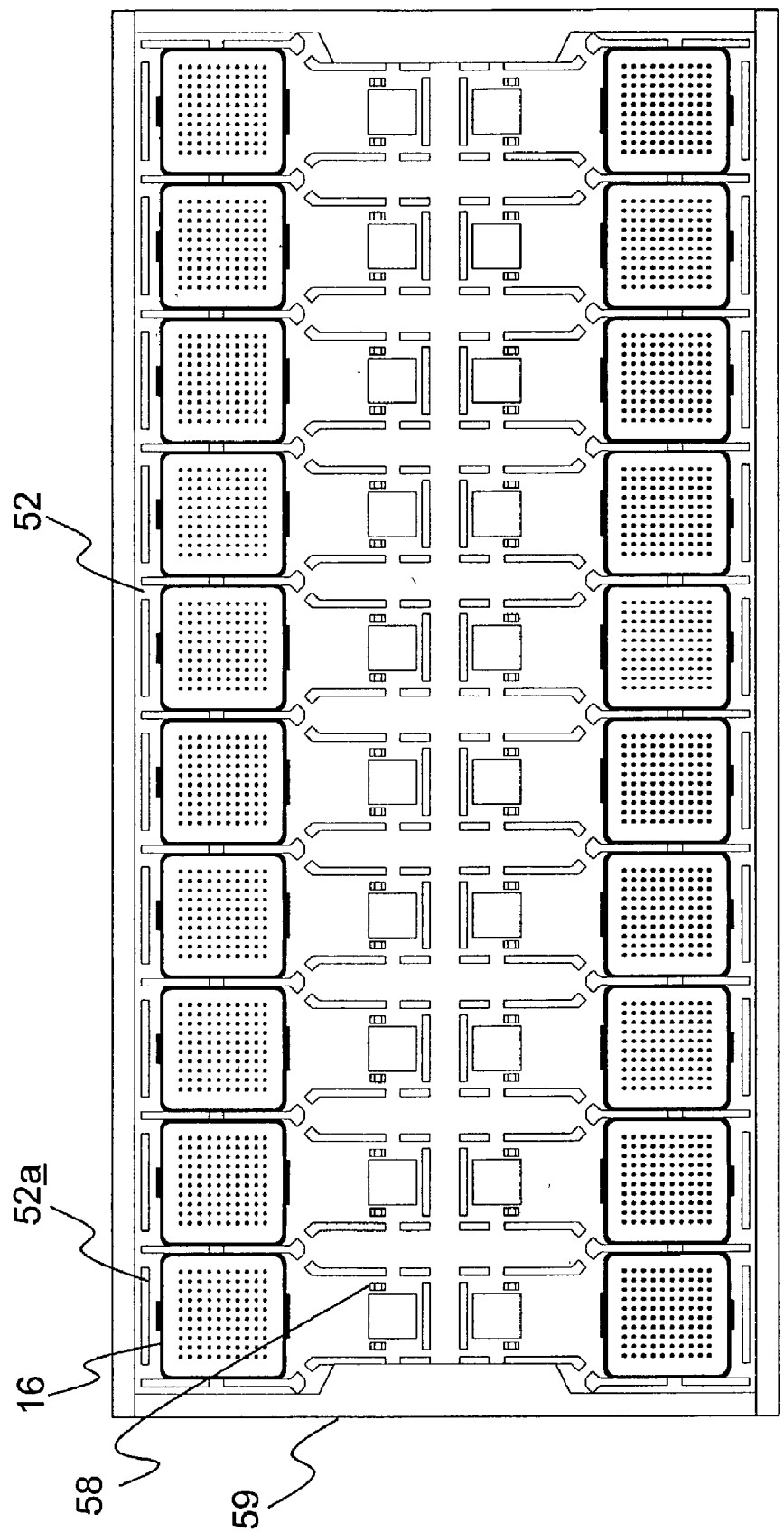
FIG. 11 shows the flex PCB panel of FIG. 10 after mounting of various components thereto.
Figure 12:
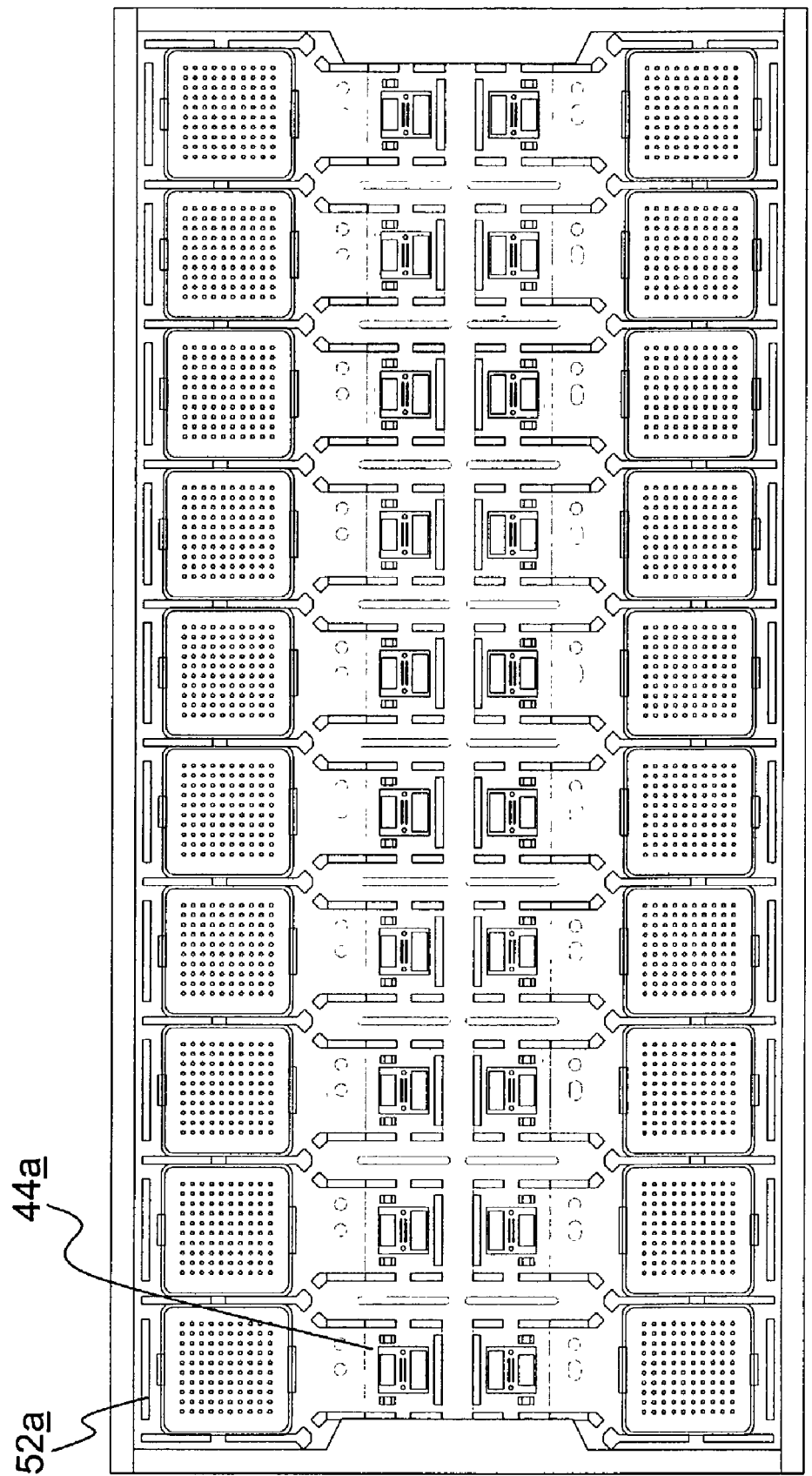
FIG. 12 shows a plurality of EOSAs after the flex PCB panel of FIG. 11 has been attached on top of the leadframe of FIG. 9.

According to a preferred embodiment, described below with reference to FIGS. 10 through 13, a single panel of flex PCB material can be used to manufacture multiple EOSAs in parallel. FIG. 10 is a schematic diagram illustrating a flex PCB panel 52 having multiple (e.g., twenty) flex PCB paddles 52a. FIG. 11 shows the flex PCB panel 52 of FIG. 10 after mounting various components thereto. FIG. 12 is a schematic plan view of the sub-assemblies after the flex PCB panel 52 of FIG. 11 has been attached on top of the leadframe 44 of FIG. 9.

Referring first to FIGS. 10 through 12, paddle cutouts 14a are preferably positioned in the flex PCB paddles 52a such that die mounted on corresponding leadframe paddles 44a can be positioned in the paddle cutout 14a. Locator holes 54 can be provided around the edge of the panel 52. The locator holes 54 can be used to fix the flex PCB panel 52 into a stiffener ring 59. Alignment holes 55 are located at each end of the flex PCB panel 52 and are used to align the flex PCB panel 52 to the leadframe 44. Release slots 56 define the final shape of the flex PCB that will be left in the EOSA.

Passive components 58 and a connector array 16 are then mounted on a top side of each of the flex PCB paddles 52a. The flex PCB panel 52 can be assembled using a process similar to processes used in the semiconductor industry. Solder paste can, for example, be screen printed onto the flex PCB paddles 52a. Various components can then be placed into the solder paste before passing the PCB panel 52 through a reflow oven to create the solder joints. Components may be mounted on both sides of the flex PCB paddles 52a. For instance, a micro-controller or Serializer/Deserializer (SerDes) may be mounted on a bottom side of a flex PCB 52a, such as beneath the connector array 16.

A plastic or metal stiffener ring 59 is preferably attached to an outside edge of the flex PCB panel 52. The ring 59 can include two parts that snap together through the small locator holes 54 in the edge of the flex PCB panel 52. Additionally, pins on the ring 59 preferably protrude through the alignment holes 55. These pins can be used to align flex PCB paddles 52a with respective leadframe paddles 44a. Thus, the stiffener ring 59 can serve to hold the flex PCB panel 52 in a flat orientation as well as to align the leadframe paddles 44a with respect to the flex PCB paddles 52a.

Epoxy glue is preferably applied either to the bottom side of the flex PCB paddles 52a or to the top side of the leadframe paddles 44a. The stiffener ring alignment pins can then be used to position the flex PCB paddles 52a on top of the leadframe paddles 44a and to hold the leadframe 44 in place. Pressure is then preferably applied from both a top and a bottom of leadframe paddle areas while the sub-assembly is positioned inside a cure oven to cure the epoxy. A strong bond is thereby created between the flex PCB paddles 52a and the leadframe paddles 44a.

Wire-Bond & Over-Mold

A wire-bond process can be used to create electrical connections between the die on the leadframe paddles 44a and the flex PCB paddles 52a. For example, die to die wire-bonds can connect the electro-optical components to their associated driver or amplifier component. The driver and amplifier can then be wire-bonded to pads on the flex PCB paddles 52a to complete the electrical connection of the sub-assembly. As mentioned previously, however, the EOSA provides a flexible platform that may mix and match wire-bond and flip chip interconnect and/or other electrical interconnection technologies within the same overall manufacturing process.

Figure 13:
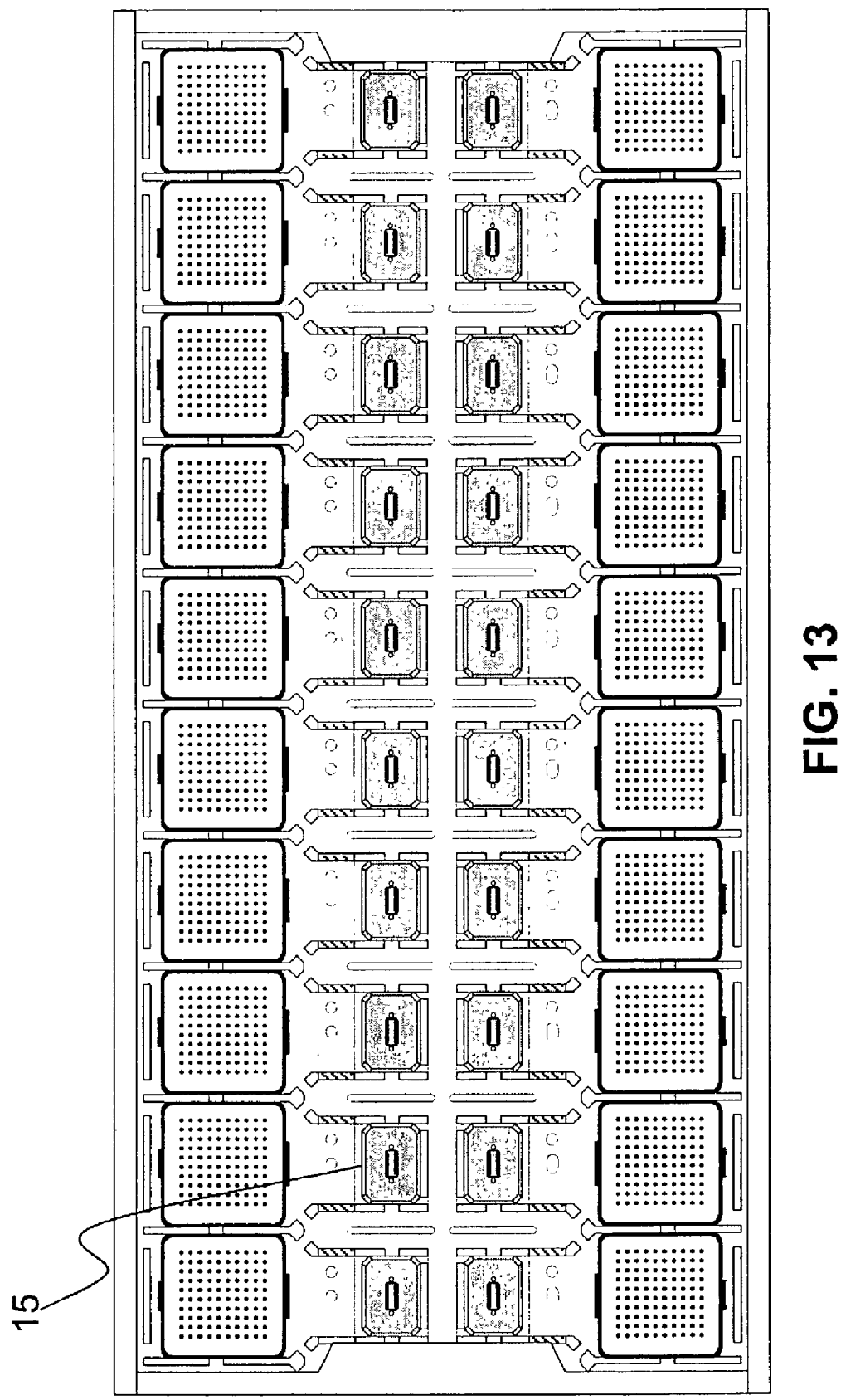
FIG. 13 shows a plurality of completed EOSAs after wire-bond and over-mold steps are applied to the EOSAs in FIG. 12.

Once wire-bonding is completed, the full sub-assembly can receive a plasma clean cycle in preparation for an over-mold process step. Plasma cleaning removes any organic contamination and roughens the surfaces to provide better adhesion for the mold compound. An array mold with twenty mold-cavities (or "pockets") is then preferably used to create the OMLA 15, as described previously. FIG. 13 shows the completed sub-assembly after the wire-bonding and over-molding steps. Mold residue (from the mold run-in channels) is omitted from this figure for clarity.

EOSA Singulation

The completed sub-assembly is then preferably singulated (divided into single EOSA units) using a mechanical punch to cut through the various holding tabs in both the flex PCB panel 52 and the leadframe panel 44. A laser could also be used to cut the individual EOSAs from the parallel sub-assembly. The singluated EOSAs are then preferably placed in a plastic component tray, similar to conventional trays used for storing semiconductor components such as Ball Grid Array packages. Conventional semiconductor component trays are typically referred to as "JEDEC" trays because they are often designed to conform to standards developed by JEDEC (formerly known as the Joint Electron Device Engineering Council). The singulated EOSAs stored in the trays can be further processed using automated equipment designed to work with that particular tray design. FIGS. 3A through 3C illustrate one example of a singulated EOSA.

Testability and Burn-in

In addition to the benefits described above, the characteristics of the EOSA also greatly improve its testability over current module designs. The lens array provides the optical interface for a module and should be tested in conjunction with the electro-optical components. The EOSA embodiments described previously provide a single sub-component that contains both the electrical and optical components. In addition, the electrical and optical interfaces can be provided on the same side of the EOSA. The EOSA can therefore be tested using an automated test platform similar to standard semiconductor test platforms.

More specifically, a test socket can be designed to accommodate both the optical and electrical interface in the same plane. The test socket may be mounted on a tester load board similar to standard semiconductor tester load-boards. An automated pick and place handler (such as used for semiconductor devices) can then be used to place the EOSA in and remove the EOSA from the test socket. The entire test process can therefore be accomplished using a method similar to methods used to test ordinary semiconductor packages.

Having simultaneous access to both the optical and electrical interface provides the ability to fully test a module in a single process. The individual lasers should be tuned for the specific optical environment in which they will be placed. A micro-controller device within the module can be programmed with laser specific parameters that store the tuning parameters generated by the test process. To tune a laser, its electrical input is preferably modulated while simultaneously measuring its optical output power.

As mentioned previously, the fact that the EOSA includes the lens array and that both the optical and electrical interfaces are on the same side, provides the ability to test the EOSA in a manner similar to testing typical semiconductor devices. Among other aspects, the OMLA of the preferred EOSA embodiments provides a lens array that can be readily aligned and tested.

Figure 14A:
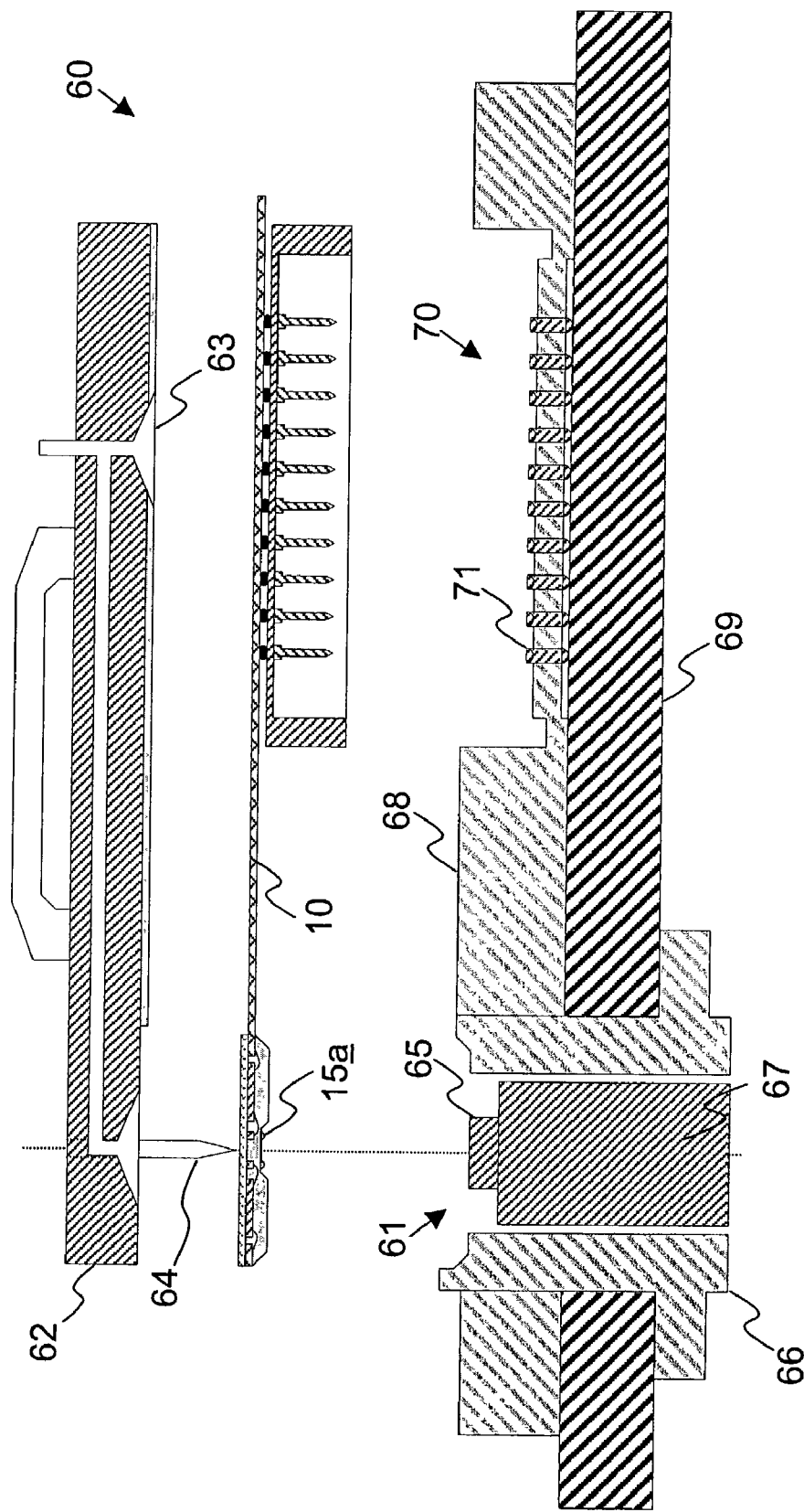
FIGS. 14A and 14B are schematic cross-sectional views of a test fixture for testing the EOSAs of FIGS. 3A through 3C, constructed according to still further inventive concepts.
Figure 14B:
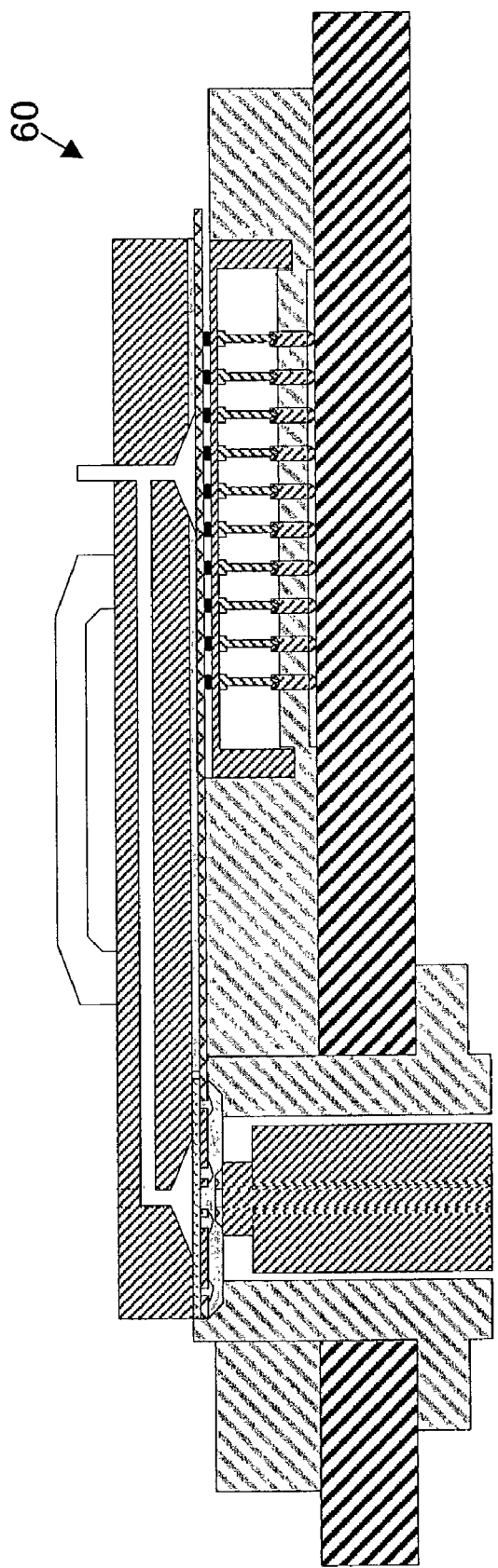

FIGS. 14A and 14B are cross sectional views of an EOSA test fixture according to another inventive concept herein. FIG. 14A is an exploded cross sectional view of the test fixture 60 and EOSA 10. FIG. 14B shows the test fixture 60 in a closed position for performing a test of the EOSA 10.

Referring to FIGS. 14A and 14B, the EOSA 10 is preferably handled by a test handler pick-up arm 62. The pick-up arm 62 picks an EOSA 10 from a JEDEC tray, inserts it into the test fixture, removes it after testing, and then places it into another JEDEC tray. The pick-up arm 62 can hold the EOSA 10, for example, using a vacuum system. In this embodiment, as in standard pick and place auto-handler pick-up arms for semiconductor systems, a vacuum force is applied through two holes 63 to hold the EOSA 10 firmly against the pick-up arm 62.

A significant difference between this system and conventional semiconductor systems, however, is the provision of two tapered alignment pins 64 in the pick-up arm 62. These pins 64 not only align the EOSA 10 with the pick-up arm 62, they further align the EOSA 10 with the fiber-optic MTP (MPO) connector 65. The pins 64 are preferably tapered to "self-align" the EOSA 10 so that the positioning of the pick-up arm does not need to be as accurate. As long as the ends of the pins 64 are directed into the EOSA alignment holes 17b (see FIG. 3B), the EOSA 10 will be centered as the pins 64 are inserted.

The test fixture 60 preferably includes a standard PCB test board 69, which includes a base for the test socket 68. The test socket preferably includes an electrical test socket 70 that uses standard pogo-pins 71 to connect to the EOSA array connector as well as an MTP receptacle 66 mounted through the test board 69. A female MTP plug connector (ferrule) 65 can be fitted inside the MTP receptacle 66. Together, these two components provide an optical socket 61. The MTP receptacle 66 preferably allows the ferrule 65 to float on spring loaded mounts, thereby enabling it to move around slightly within the MTP receptacle 66. In this manner, when the handler pick-up arm 62 inserts the EOSA 10 into the test fixture, the alignment pins 64 cause the ferrule 65 to move into correct alignment with an EOSA lens array 15a.

The ferrule 65 preferably contains an array of optical fibers 67 that match up with the lenses in the EOSA lens array 15a. The fibers 67 optically connect the EOSA 10 to the optical test equipment (or a simple loop-back) used to test the EOSA 10. The pogo-pins 71 can connect to pads on the top side of the test board PCB 69, which are preferably in turn connected to the electrical tester to be used. The MTP receptacle 66 and ferrule 65 preferably conform to International Electrotechnical Commission (IEC) standard 61754-7.

Current VCSEL diodes require production burn-in to eliminate early life failures. In this embodiment, the burn-in process can be performed by mounting the EOSAs onto a burn-in board and then placing the burn-in board in an oven. The burn-in board can be configured with an array of sockets that allow several EOSAs to be simultaneously connected through their electrical connectors. These sockets can provide power and stimulus signals for the VCSELs and other components mounted within the EOSA. During burn-in, there is no need to interface to the optical socket. By configuring the EOSA in a manner similar to standard semiconductor parts, the burn-in process and equipment can also be similar to that used in the semiconductor industry.

Module Assembly

Fully tested and burned-in EOSAs are assembled into modules. FIG. 15 is a schematic cross-sectional view of an assembled module 80. The assembled module 80 preferably contains three main components, a heatsink 82, an EOSA 10, and an MTP receptacle 81. The heatsink 82 forms the main body of the module. The heatsink 82 preferably includes two precision placed alignment pins 83, which are used to properly align the EOSA 10 and the MTP connector of the fiber ribbon cable. The MTP receptacle 81 can be arranged in a proximal end of the module 80.

These components can be assembled in any one of several sequences. In one example, the EOSA 10 is placed into the end of the MTP receptacle 81. The heatsink alignment pins 83 are inserted into the back-side of the EOSA 10, and the MTP receptacle 81 can then be secured to the heatsink 82 with screws. The EOSA 10 is thereby held in place between the MTP receptacle 81 and the heatsink 82, and is correctly aligned using the alignment pins 83. The EOSA 10 can then be folded-up underneath the heatsink 82. The EOSA 10 is preferably secured to the bottom of the heatsink 82 with epoxy glue.

While the inventive principles herein have been shown and described with reference to preferred embodiments thereof, it will be understood by those skilled in the art that various changes in form and details may be made without departing from those principles. The various alternative embodiments described below, for example, represent changes to the form and details of the embodiments described previously while retaining inventive principles thereof.

Among other variations, alternatives to the Over-Molded Lens Array (OMLA) are available. For example, instead of molding the lens array directly on top of the leadframe, it is possible to injection-mold a separate lens array that is then fitted over the leadframe after wire-bonding. This alternative method provides a slightly lower technology risk, because separately molded lens arrays can be manufactured using widely-available technology.

Unfortunately, however, this method may have slightly higher costs because the lens arrays may be molded one at a time in a separate process that does not utilize the existing semiconductor mold equipment. Even when molded in parallel, however, the extra step of fixing the individual lens arrays to the leadframe adds cost and complexity. This variation may also provide slightly lower reliability because the semiconductor dies may not be completely sealed from the outside environment. In addition, this process may result in a slightly lower yield because the alignment tolerance between the lens array and the electro-optical die may be less accurate when compared to the OMLA.

Alternative methods for aligning the electro-optical die on the leadframe are also possible. One way to improve the accuracy of the alignment between the electro-optical die and the leadframe is to create a Silicon Optical Alignment Pallet (SOAP). A SOAP is a small rectangle of silicon in which two alignment holes (for the two alignment pins) are etched all the way through, and in which accurate fiducials are marked with reference to those holes. The SOAP is first attached to the leadframe and the electro-optical die are then placed on top of the pallet and aligned to the fiducials on the silicon. It is expected that the SOAP will be more accurate than holes drilled in the leadframe and associated fiducials marked on the leadframe. This solution is slightly more costly, however, than the earlier described solution and also adds complexity to the construction of the EOSA.

Alternative flex PCB configurations are possible. For instance, instead of a single piece of flex PCB, it is possible to use rigid flex PCB. In one embodiment using this alternative, the flex PCB has rigid panels laminated to each end (one over the leadframe end and the other over the array connector end). By forming accurate holes in the rigid areas of the flex PCB, it may be possible to remove the leadframe entirely from the construction. This would provide a cost advantage and simplify the construction of the EOSA. A disadvantage, however, is that the thermal conduction path from the electro-optical die must then pass through an organic substrate (i.e., the PCB) with higher thermal resistance, rather than through the leadframe. In addition, the alignment holes may not be as accurately placed in the rigid PCB panels as compared to the leadframe, which would impact the final yield of the EOSAs.

Having described the foregoing inventive concepts in terms of several different embodiments and alternatives, it should be understood that still additional variations and configurations are available within the level of ordinary skill in the art. The inventive concepts should therefore be interpreted to encompass all such variations coming within the spirit and scope of the appended claims.

What is claimed is:

1. A method of manufacturing a plurality of electro-optical sub-assemblies in parallel, said method comprising:
    forming a plurality of printed circuit boards (PCBs) on a panel of flex material;
    forming one or more leadframe cutout regions in each of the PCBs;
    forming a plurality of leadframes on a matrix leadframe;
    attaching the matrix leadframe to the panel of flex material such that the plurality of leadfranes are arranged in proximity to the one or more leadframe cutout regions;
    arranging a plurality of electrical components comprising electro-optical semiconductor devices on the plurality of leadframes;
    forming electrical interconnections between the plurality of electrical components on the plurality of leadframes and corresponding ones of the plurality of PCBs;
    aligning lens arrays over the electro-optical semiconductor devices; and
    singulating the PCBs.

2. The method according to claim 1, further comprising attaching array connectors to the plurality of PCBs to provide electrical interconnections with external devices.

3. The method according to claim 1 further comprising aligning the electro-optical semiconductor devices on the plurality of leadframes.

4. The method of claim 3, wherein aligning lens arrays over the electro-optical semiconductor devices comprises using an alignment mechanism to align the lens arrays with the plurality of leadframes containing the electro-optical semiconductor devices.

5. The method of claim 4, wherein the alignment mechanism comprises a plurality of matching alignment holes formed in the plurality of leadframes and in the lens arrays.

6. The method according to claim 1, wherein aligning lens arrays over the electro-optical semiconductor devices comprises molding lens arrays over the plurality of leadframes in alignment with the electro-optical semiconductor devices.

7. The method according to claim 1, further comprising forming release slots in the flex material, and wherein singulating the PCBs comprises punching out the PCBs or laser cutting tabs defined by the release slots formed in the flex material.

8. A method of manufacturing a plurality of electro-optical sub-assemblies in parallel, said method comprising:
    forming a plurality of printed circuit boards (PCBs) on a panel of flex material;
    arranging a rigid substrate along a region of each of the PCBs;
    arranging a plurality of electrical components comprising electro-optical semiconductor devices on the rigid substrates;
    aligning the electro-optical semiconductor devices on the rigid substrate;
    aligning lens arrays over the electro-optical semiconductor devices using an alignment mechanism to align the lens arrays with the rigid substrate containing the electro-optical semiconductor devices, wherein the alignment mechanism comprises a plurality of matching alignment holes formed in the rigid substrate and in the lens arrays; and
    singulating the PCBs.

9. The method according to claim 8, wherein the rigid substrate comprises a leadframe and wherein arranging a rigid substrate along a region of each of the PCBs comprises:
   forming one or more leadframe regions in each of the PCBs;
   forming a plurality of leadframes on a matrix leadframe;
   attaching the matrix leadframe to the panel of flex material such that the leadframes are arranged in proximity to the leadframe cutout regions; and
   forming electrical interconnections between the electrical components on the leadframe and the PCBs.

10. The method according to claim 8, wherein said rigid substrate comprises a rigid region of the PCB.

11. The method according to claim 8, further comprising attaching array connectors to the plurality of PCBs to provide electrical interconnections with external devices.

12. The method according to claim 8, further comprising, forming release slots in the flex material, and wherein singulating the PCBs comprises punching out the PCBs or laser cutting tabs defined by the release slots formed in the flex material.

13. A method of manufacturing a plurality of electro-optical sub-assemblies in parallel, said method comprising:
   forming a plurality of printed circuit boards (PCBs) on a panel of flex material;
   arranging a rigid substrate along a region of each of the PCBs;
   arranging a plurality of electrical components comprising electro-optical semiconductor devices on the rigid substrates;
   aligning lens arrays over the electro-optical semiconductor devices using an alignment mechanism to align the lens arrays with the rigid substrate containing the electro-optical semiconductor devices, wherein the alignment mechanism comprises a plurality of matching alignment holes formed in the rigid substrate and in the lens arrays; and
   singulating the PCBs.

14. The method according to claim 13, wherein the rigid substrate comprises a leadframe and wherein arranging a rigid substrate along a region of each of the PCBs comprises:
   forming one or more leadframe regions in each of the PCBs;
   forming a plurality of leadframes on a matrix leadframe;
   attaching the matrix leadframe to the panel of flex material such that the leadframes are arranged in proximity to the leadframe cutout regions; and
   forming electrical interconnections between the electrical components on the leadframe and the PCBs.

15. The method according to claim 13, wherein said rigid substrate comprises a rigid region of the PCB.

16. The method according to claim 13, further comprising aligning the electro-optical semiconductor devices on the rigid substrate.

17. The method according to claim 13, further comprising forming release slots in the flex material, and wherein singulating the PCBs comprises punching out the PCBs or laser cutting tabs defined by the release slots formed in the flex material.

* * * * *